(12) United States Patent
Ginetti et al.

(10) Patent No.: US 6,622,290 B1
(45) Date of Patent: Sep. 16, 2003

(54) TIMING VERIFICATION METHOD EMPLOYING DYNAMIC ABSTRACTION IN CORE/SHELL PARTITIONING

(75) Inventors: Arnold Ginetti, Antibes (FR); Mark Steven Hahn, Milpitas, CA (US); Harish Kriplani, Santa Clara, CA (US); Naser Awad, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 79 days.

(21) Appl. No.: 09/678,150

(22) Filed: Oct. 3, 2000

(51) Int. Cl.[7] ............................................. G06F 17/50
(52) U.S. Cl. ........................ 716/6; 716/6; 716/13; 716/14; 703/19; 714/726
(58) Field of Search ................... 716/6, 16, 7; 714/726; 713/500; 438/109, 14, 15; 706/45; 29/843, 855, 874

(56) References Cited

U.S. PATENT DOCUMENTS

| | | | | |
|---|---|---|---|---|
| 5,650,938 A | * | 7/1997 | Bootehsaz et al. | 716/6 |
| 6,014,510 A | * | 1/2000 | Burks et al. | 703/9 |
| 6,134,687 A | * | 10/2000 | Chakradhar et al. | 714/726 |

* cited by examiner

*Primary Examiner*—Matthew Smith
*Assistant Examiner*—Yelena Rossoshek
(74) *Attorney, Agent, or Firm*—Reed Smith Crosby Heafey LLP; John W. Carpenter

(57) ABSTRACT

A method for timing verification of very large scale integrated circuits reduces required CPU speed and memory usage. The method involves steps including partitioning the circuit into a plurality of blocks and then partitioning the verification between shell path components and core path components. Timing verification is then conducted for only shell path components while core path components are abstracted or ignored. Finally, timing verification for core path components in each block completes the process for the entire design.

9 Claims, 1 Drawing Sheet

TIMING VERIFICATION METHOD EMPLOYING DYNAMIC ABSTRACTION IN CORE/SHELL PARTITIONING

BACKGROUND OF THE INVENTION

1. Field of the Invention

The present invention relates generally to large VLSI circuit designs and more particularly to computer-aided timing analysis of sequential circuits.

2. Background Art

CMOS Technology has made massive strides over the last two decades and is now the dominant choice for large VLSI designs. Recent projections on changes in technology have shown that great changes are required in design methodologies of the future to keep pace. Specifically, due to increases in design complexity, it will be essential for designers to place an even greater reliance on computer-aided design (CAD) tools to ensure the required increase in productivity. With timing optimization becoming one of the all-important factors as clock frequencies are forced upwards, CAD strategies for timing optimization are becoming essential. Traditional techniques that consider one combinational block at a time in a sequential circuit can no longer suffice, and more aggressive sequential timing optimization will be required.

A general sequential circuit is a network of computation nodes (gates) and memory elements (registers). The computational nodes may be conceptualized as being clustered together in a network of gates that forms a combinational logic circuit.

Pipelined systems are a special subset of the class of general sequential circuits, and are primarily used in datapaths. A pipelined system uses registers to capture the output of each logic stage at the end of each clock period. Data proceeds through each combinational block, or pipeline stage, until it reaches the end of the pipeline, with the registers serving to isolate individual stages so that they may parallel process data corresponding to different data sets. The use of this parallelism causes an increase in the data throughput rate of the system.

Physically a Netlist is a set of interconnected components. A high level Netlist can be above the component level. A Netlist is a method for going from some level of conceptual design to component design. The most structured Netlist is a layout of physical components and their interconnections which can go to a manufacturer who can actually make the chip from that most sophisticated and complicated Netlist. There are two categories of components, the pure combinational component and the sequential component. Combinational components consist of AND gates, OR gates and the like. Combinational components have outputs which change depending on the input. In sequential components, the output does not necessarily depend on the data inputs, but changes only after a clock input or enable input is also received, making these sequential components synchronous devices.

The period of the clock signal should be longer than the total delay between two sequential components through one or more combinational components so that when a clock signal triggers the output to follow the input, the data at the input is already there and appropriate for that particular input. The data has to be there when the clock signal arrives, otherwise it isn't good data. If the total delay through the combinational components is greater than the clock period, then the design will not work. What the designer wants to do before sending the design to the manufacturer, is to use a timing verifier to verify that everywhere in the design, every arc of delay through a series of combinational components is smaller than the clock period. The timing verifier receives a Netlist. It also receives a component library which has a series of look-up tables which tell the timing verifier what is the delay of each component in the Netlist. The timing verifier reads in the Netlist, gets the timing information for each component from the library and then propagates the timing and checks to see if it is proper. The timing verifier also recognizes sequential elements from the library. The timing verifier also receives the clock period information. Each region between two sequential components has to be checked by the time verifier individually to see if it satisfies the clock period criteria. If there is a problem in timing where the arc delay does not satisfy the clock period criteria, the user has two choices. He can either modify the clock period or change the design. The timing verifier is a software tool which issues informational reports which report either that all the timing is proper or identifies those combinational logic regions where the timing is a problem. The Netlist is provided as an ASCI file. It also generates a timing data structure which records so much information that its memory has to be greater than the Netlist data structure and the bigger the design, the more time it will take for the timing verifier to verify that all of the timing constraints are satisfied. The average chip can be huge, having dozens of millions of components. Therefore, most chip designs employ a divide and conquer methodology where the chip is divided into a large number of interior blocks and each one is assigned to a different designer. One design architect will have the responsibility of putting all the blocks together to form the entire chip. If one were to verify the timing of an entire design, the required memory may be more than the analysis memory available and in addition the CPU time for the verifier would be so long as to be unacceptable.

Another timing analysis software tool is called the timing budgeter. The timing budgeter is designed to assess the placement criticality regarding timing delays between blocks. The timing budgeter uses the same information as the timing verifier and the data Netlist and it is entirely dependent upon the timing verifier algorithm in terms of determining where the critical timing delays are located between blocks.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment when taken in conjunction with the following drawings in which.

SUMMARY OF THE INVENTION

Figure 1:
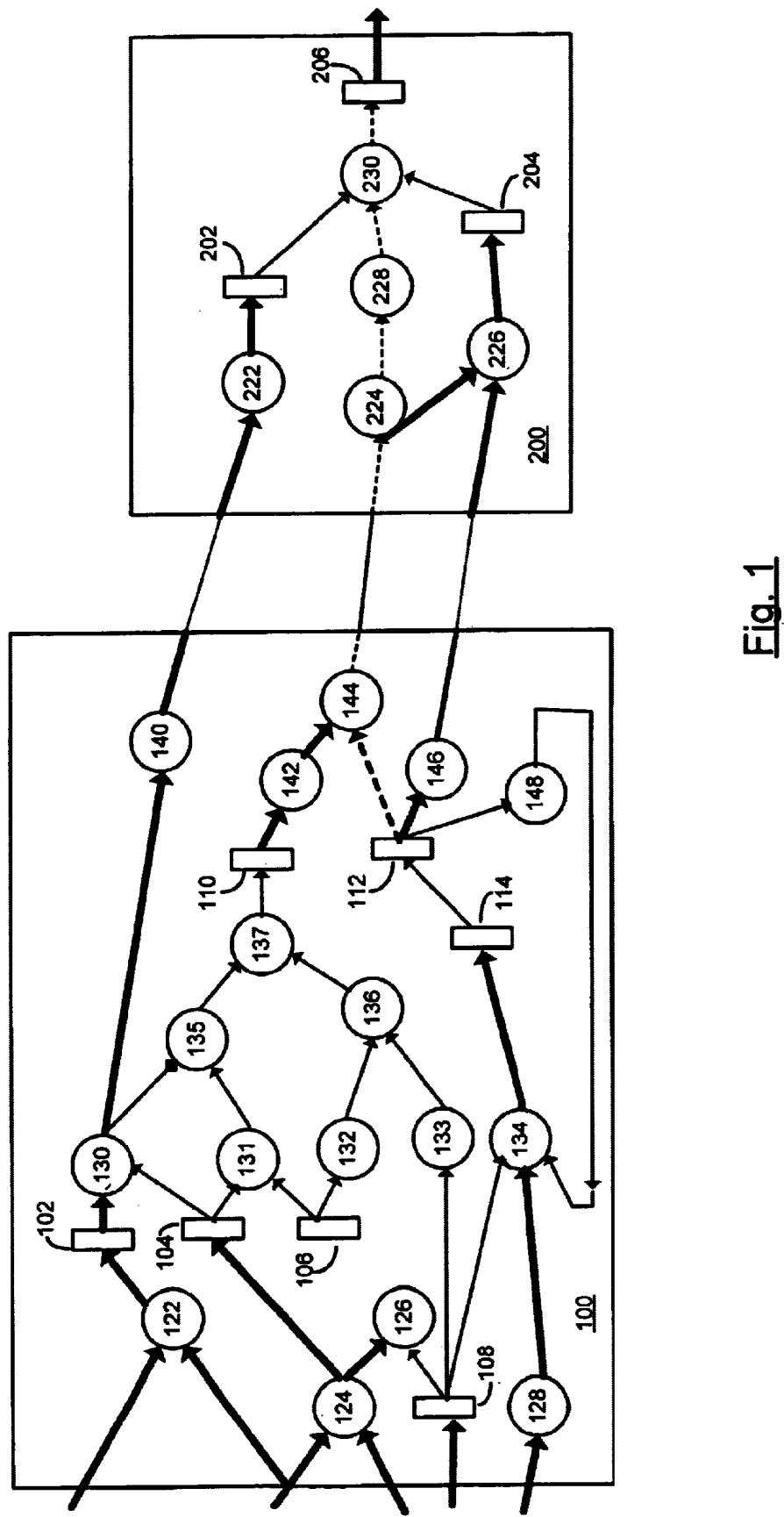
FIG. 1 illustrates a partial net list showing two blocks (100 and 200) partitioned into shell and core path components.

The present invention comprises a unique method for timing verification of the blocks of very large scale circuits with reduced CPU time and memory requirements by employing a partitioning scheme. The invention comprises a mechanism to divide the complete design into a core and shell structure for each block The invention initiates by employing budget timing to derive timing constraints on each block of the circuit. The timing verifier then need be concerned only with the top timing path which consists of the timing delay between blocks. This is accomplished by flagging all interior components, that is, components between sequential components within each block so that they can be ignored or abstracted. The timing verifier will initially not build any timing data structure for those components. The timing structure developed therefore in this step pertains only to what are called shell components, that is, the components between sequential components of distinct blocks. If all of these shell components for all of the blocks respect the timing requirements, the next step is to expose the entire design to the timing verifier. Each entire block is checked one by one. However, the timing verifier does not have to check timing for shell components, but only timing for what are referred to as core components. Each core verification is accomplished, one block at a time until all the blocks of the entire circuit have been checked for proper timing.

One of the aspects of the present invention in dividing up the timing analysis between the structure comprising core components and the structure comprising shell components, is that the timing budgeter can make interconnection criticality assessments based only on the shell components and thereby also reduce memory requirements and reduce required CPU speed. The invention includes an automatic timing verification algorithm which includes identifying the various core components and abstracting the core components, which means flagging them to have the timing verifier and timing budgeter ignore the core components. The term abstraction as used herein means to pay no attention or to ignore or treat as a black box that cannot be looked at. In other words, the core is treated as an abstract box with zero delay. Core/shell partitioning can also be used in conjunction with Netlist optimization to reduce the memory and timing requirements in circuit design optimization, as well as in timing analysis. The key component of the invention is dynamic abstraction to aid in timing analysis, timing budgeting, timing optimization and timing verification. The term dynamic in the phrase dynamic abstraction means it is automatic. Thus, a key feature of the invention herein is the automatic flagging of certain components to be ignored for purposes of a step in timing verification. It is novel to provide such flagging or ignoring core or shell components, even though they are in the Netlist.

DETAILED DESCRIPTION OF A PREFERRED EMBODIMENT

The invention is based on the division of an entire chip design into a plurality of individual blocks and then division of each block into a core and shell structure.

There are two parts to the invention. The first part follows from the realization that the logic elements within each physical block can be partitioned into two sets: those that participate in global timing constraints and those that do not. This yields a partition of each physical block into a core (elements limited to interacting with local timing constraints) and shell (elements related to global timing constraints) as shown in the accompanying FIG. 1.

The decomposition of the chip into global and local timing constraints is achieved using the notions of Core Paths and Shell Paths. For the purposes of this disclosure, a tri-state gate is treated as to a combinational logic gate. The term memory element refers to a flip-flop, level-sensitive latch or RAM/ROM element. The input of a memory element includes both the clock and data inputs. Shell and core paths are defined herein as follows:

Definition
A Path P is a Shell Path if:
1. P is from an input pin of block B to an input of a memory element of B or an output pin of B; or
2. P is from the output of a memory element to an output pin of B.

Definition:
A path P from the Output of a Memory Element to an Input of a Memory Element is Called a Core Path.

By definition, every path must either be a Shell Path or a Core Path.

Under the most naive clock design, the timing constraint for a Core Path is that its delay is less than the clock period. These timing constraints can easily be extended to account for multiple clocks, false paths, multiple cycle paths, clock skews, and cycle stealing constraints that arise in more realistic clock designs.

Note that the timing constraint for a Shell Path is not explicitly specified. Consider the net-list shown by the broken line in FIG. 1 (memory element 112, circuit components 144, 224, 228, 230 and memory element 206). The liming constraint for the two Shell Paths plus the global interconnect (all indicated by the broken line in the figure) is that the total delay is less than the clock period. Since the delay of the global interconnect will be extracted (or computed) using the actual chip-level route (including optimal buffering) we now have the Timing constraint that the delay of the two Shell Paths is less than the clock period minus the global interconnect delay between the two Shell Paths.

The first step of the invention is to first verify timing only for shell components by identifying and abstracting core components. The second step then verifies timing for the core components of each block thereby completing the timing verification for the entire design.

Having thus disclosed a preferred embodiment of the invention, it will be understood that various modifications and additions are contemplated. By way of example, other types of verification partitions may be useful for achieving the advantages of the invention. Accordingly, the invention is to be limited only by the scope of the appended claims and their equivalents.

We claim:
1. A method for verifying proper timing relationships in a very large scale circuit design; the method comprising the steps of:

dividing the circuit design into a plurality of blocks;

defining a shell path component as a component on a path P where P is from an input pin of a block to an input of a memory element of a block or where P is from an output of a memory element to an output pin of a block;

defining a core path component as a component on a core path C where C is from the output of a first memory element to an input of a second memory element, said first and second memory elements being within the same block;

determining which of the components in said circuit design are core path components and which are shell path components;

verifying timing relationships of the shell path components while ignoring the core path components; and verifying timing relationships of core path components in each said block.

2. The method according to claim 1, wherein said steps are implemented in a timing budgeter.

3. The method according to claim 2, wherein said timing budgeter makes interconnection assessments based only on the shell components.

4. The method according to claim 1, wherein said steps are utilized in a timing verifier.

5. The method according to claim 1, wherein:

said steps of defining a core path and defining a shell path comprise core and shell partitioning; and said core and shell partitioning is used in conjunction with a netlist optimization.

6. The method according to claim 1, wherein said method comprises a dynamic abstraction utilized in at least one of timing analysis, timing budgeting, timing optimization, and timing verification of a circuit design.

7. The method according to claim 1, further comprising the step of automatically flagging components on core paths to be ignored for liming verification.

8. The method according to claim 1, wherein said steps are embodied as computer instructions stored on a computer readable media, and, said computer instructions, when executed in a computer, cause the computer To perform said steps.

9. A method for verifying proper timing relationships in a very large scale circuit design, the method comprising The steps of:

dividing the circuit design Into a plurality of smaller interconnected portions;

defining a core path component as a component on a core path C where C is from an output of a first memory element to an input of a second memory element, wherein said first and second memory elements are in a same portion;

defining a shell path component as a component on a path P where P is from an input pin of a portion to an input of a memory element of a portion or where P is from an output of a memory element to an output pin of a portion;

establishing at least two types of component criteria so that some components in said circuit design satisfy one of said criteria and the remainder of said circuit design components satisfy another of said criteria;

verifying a timing parameter in said circuit design for said components that satisfy said one of said criteria while ignoring said remainder of said components; and verify said timing parameter in said circuit design for said remainder of circuit components wherein said component criteria comprise whether a component is on a core path and whether a component is on a shell path.

* * * * *